US009882312B2

(12) United States Patent
Franke et al.

(10) Patent No.: US 9,882,312 B2
(45) Date of Patent: Jan. 30, 2018

(54) ELECTRICAL CONNECTING DEVICE

(71) Applicant: e.solutions GmbH, Ingolstadt (DE)

(72) Inventors: Thomas Franke, Laupheim (DE); Michael Himmel, Ulm (DE)

(73) Assignee: e.solutions GmbH, Ingolstadt (DE)

(*) Notice: Subject to any disclaimer, the term of this patent is extended or adjusted under 35 U.S.C. 154(b) by 46 days.

(21) Appl. No.: 14/711,049

(22) Filed: May 13, 2015

(65) Prior Publication Data

US 2015/0333453 A1   Nov. 19, 2015

(30) Foreign Application Priority Data

May 15, 2014  (DE) .................. 10 2014 007 637

(51) Int. Cl.

| H01R 13/641 | (2006.01) |
|---|---|
| H01R 13/66 | (2006.01) |
| H01R 43/16 | (2006.01) |
| G01R 27/02 | (2006.01) |
| H01R 43/26 | (2006.01) |
| G01R 31/04 | (2006.01) |

(52) U.S. Cl.
CPC ........... H01R 13/641 (2013.01); G01R 27/02 (2013.01); H01R 13/665 (2013.01); H01R 43/16 (2013.01); H01R 43/26 (2013.01); G01R 31/041 (2013.01)

(58) Field of Classification Search
CPC ... H01R 13/641; H01R 13/6683; H01R 12/75
USPC .......................... 439/489, 955, 493, 285, 218
See application file for complete search history.

(56) References Cited

U.S. PATENT DOCUMENTS

| 5,802,328 | A | 9/1998 | Yoshimura | |
|---|---|---|---|---|
| 6,336,816 | B1* | 1/2002 | Yatskov | H01R 12/721 |
| | | | | 439/493 |
| 8,876,559 | B2* | 11/2014 | Wu | H04R 5/04 |
| | | | | 439/669 |
| 2004/0072468 | A1* | 4/2004 | Engquist | H01R 9/0515 |
| | | | | 439/493 |

(Continued)

FOREIGN PATENT DOCUMENTS

| DE | 102011050638 A1 | 3/2012 |
|---|---|---|
| JP | 2011258471 A * | 12/2011 |
| WO | WO-2013005076 A1 | 1/2013 |

OTHER PUBLICATIONS

JP 2011258471 English translation.*
JP 2011258471 dated Dec. 2011—English translation.*

*Primary Examiner* — Tulsidas C Patel
*Assistant Examiner* — Marcus Harcum
(74) *Attorney, Agent, or Firm* — Marshall, Gerstein & Borun LLP

(57) ABSTRACT

An electrical connecting device is described that is designed to indicate a geometrical orientation of a connection between this connecting device and a complementary connecting device when the two connecting devices are connected to one another. The connecting device comprises at least one terminal for contacting by the complementary connecting device, whereby the terminal comprises a plurality of contact regions. Differing electrical parameters are assigned to the contact region, so that in the event of a contacting of the terminal by the complementary connecting device a resultant parameter is assigned to the contacting of the terminal, which indicates in which contact region (or in which group of contact regions) the contacting exists.

18 Claims, 5 Drawing Sheets

(56) References Cited

U.S. PATENT DOCUMENTS

2010/0159740 A1* 6/2010 Zhang ................. H01R 23/661
439/499
2014/0125352 A1* 5/2014 Franke ................. G01R 31/043
324/538

* cited by examiner

ELECTRICAL CONNECTING DEVICE

TECHNICAL FIELD

The present invention relates generally to the field of electrical connecting devices. In concrete terms, an electrical connecting device is specified, the geometrical orientation of which with respect to a complementary electrical connecting device is ascertainable.

BACKGROUND

When constructing electrical or electronic systems, separate components or assemblies are often provided which in subsequent working steps have to be functionally connected to one another. For this purpose a plurality of differing electrical connecting devices are known. In this case, multi-core ribbon cables have proved their worth, in particular for a connection for signal transmission between communicating electrical or electronic components.

A miniaturisation of conventional ribbon cables, which finds application in particular in the field of printed circuit boards, is represented by so-called flexible printed circuits (FPCs). With these, instead of wire strands parallel conductor tracks are applied directly on a flexible tape-like insulator. By this means, particularly small conductor diameters and also a dense arrangement of conductor tracks within the lead are possible. For the purpose of connecting pcb components, for example, use is made, as a rule, of flexible printed circuits having a conductor density of one or two conductors per millimetre in the case of a width of the flexible printed circuit of up to several centimetres. For a connection of such flexible printed circuits, the sensitive ends of the conductor tracks are often clipped onto special plug-in connectors which require only a slight contact pressure, so-called zero-insertion-force connectors or ZIF connectors.

Above all in the field of the series production of consumer electronics or vehicle electronics an automated processing of flexible printed circuits is often desirable. In this case, however, besides the mechanical sensitivity of the thin ends of the conductors a particular difficulty consists in the fact that the quality of the connection between flexible printed circuit and plug-in connector depends sensitively on a correct geometrical orientation of the connecting parts. For example, just a slight offset or a tilting of the connecting parts relative to one another may result in an inadequate mechanical stability of the connection and also in a faulty contacting of one or more terminals.

At the same time, within the scope of an automated processing procedure the quality of the connection, or, to be more exact, the geometrical orientation of the connecting parts, can only be registered with difficulty and often not with sufficient precision. For instance, although it is known that differing types of wrong connections can be registered and displayed by video surveillance of the plug-in procedure, such a surveillance has proved to be relatively elaborate and, in addition, often not sufficiently reliable.

SUMMARY

Therefore a technique for ascertaining the quality of an electrical connection is desirable, by means of which at least some of the aforementioned disadvantages can be avoided or diminished.

According to a first aspect, an electrical connecting device is described that is designed to indicate a geometrical orientation of a connection between the connecting device and a complementary electrical connecting device when the connecting device is connected to the complementary connecting device. The connecting device includes at least one first terminal for contacting by the complementary connecting device, whereby the first terminal comprises a plurality of first contact regions, whereby differing first electrical parameters are assigned to the first contact regions, so that in the event of a contacting of the first terminal by the complementary connecting device a first resultant parameter is assigned to the contacting of the first terminal, which is determined by at least one of the first parameters and indicates in which first contact region or in which group of first contact regions the contacting exists, whereby the first contact region or the group of first contact regions in which the contacting exists is defined by the geometrical orientation of the connection between the connecting device and the complementary connecting device.

In some arrangements, the geometrical orientation of the connection between the connecting device and the complementary connecting device may vary with respect to at least one of a relative displacement, tilting and/or rotation of the connecting devices relative to one another.

In some arrangements, the geometrical orientation of the connection may vary between at least one preferred and one disadvantageous orientation. In this case a preferred orientation may correspond to a connection of higher quality, and a disadvantageous orientation to a connection of lesser quality. The quality of the connection may in this case be determined by at least one of mechanical and electrical features of the connection. In particular, a connection of higher quality may exhibit a higher mechanical load-carrying capacity or a lower electrical resistance than a connection of lesser quality. In addition, in the case where several terminals are present in the electrical connecting device for contacting by the complementary connecting device a connection of higher quality may correspond to a desirable contacting of the terminals, and a connection of lesser quality to an undesirable contacting of the terminals.

In some arrangements, the connecting device may furthermore be designed to permit, in the event of contacting of the first terminal by the complementary connecting device, the setting-up of a test circuit through the contacted first terminal for the purpose of ascertaining the first resultant parameter.

In some arrangements, at least one second terminal of the electrical connecting device may comprise a plurality of second contact regions, whereby differing second electrical parameters are assigned to the second contact regions, so that in the event of an electrical contacting of the second terminal by the complementary connecting device a second resultant parameter is assigned to the contacting of the second terminal, which is determined by at least one of the second parameters.

In some arrangements, the second resultant parameter may indicate in which second contact region or in which group of second contact regions the contacting exists, whereby the second contact region or the group of second contact regions in which the contacting exists has likewise been defined by the geometrical orientation of the connection between the connecting device and the complementary connecting device. The connecting device may in this case be further designed to permit, in the event of contacting of the second terminal by the complementary connecting device, the setting-up of a test circuit through the contacted second terminal for the purpose of ascertaining the second resultant parameter.

In some arrangements, the second terminal may be arranged in relation to the first terminal in such a manner that the ascertainment of the second resultant parameter permits a more precise ascertainment of the geometrical orientation of the connection than an ascertainment solely of the first resultant parameter.

In some arrangements, the first and the second electrical parameters may be different in such a way that in the event of an electrical contacting of the first and of the second terminal by the complementary electrical connecting device, and in the case where a common electrical connection is present by virtue of the contacting points of the first and of the second terminal, a third resultant parameter is assigned to the electrical connection, which is determined at least partly by the first and the second resultant parameter and indicates the first and the second resultant parameter. For the purpose of setting up an electrical connection between the contacting points, the connecting device may further exhibit test contacts which have respectively been electrically connected to the several contact regions of a terminal.

In some arrangements, at least one of the parameters may be defined by at least one electrical component. In this case the electrical component may be a part of the connecting device.

In some arrangements, values of the parameters may be selected from an electrical resistance, an electrical capacitance and an electrical inductance. The values of the parameters preferentially correspond to differing electrical resistances. For instance, a lower electrical resistance may be assigned to a contacting in one of the contact regions of a terminal than to a contacting in another contact region of the same terminal.

In some arrangements, all the contact regions may be electrically connected to one another. In particular, all the contact regions of a terminal may be electrically connected to one another. In addition, all the contact regions of differing terminals may be connected to one another by means of an electrical connection between the terminals. Such a connection may be suitable to facilitate the setting-up of a test circuit through the differing terminals of the connecting device.

In some arrangements, the electrical connecting device may include at least three terminals, whereby the first terminal is arranged in an outer position with respect to the remaining terminals. Furthermore, a second terminal of the connecting device, which comprises a plurality of second contact regions, may also be arranged in an outer position with respect to the remaining terminals.

In some arrangements, the electrical connecting device may include several terminals that are arranged at least substantially in one plane. For example, all the terminals of the connecting device may be arranged in one plane.

In some arrangements, the electrical connecting device may include several terminals and also, furthermore, a ribbon cable with several cores, whereby at least some of the several terminals are connected to the several cores.

According to another aspect, an electrical connecting system is described. The electrical connecting system includes an electrical connecting device of the type presented herein and a complementary electrical connecting device that is designed to contact at least the first terminal of the electrical connecting device when the electrical connecting device and the complementary connecting device are connected to one another, whereby a connection between the electrical connecting device and the complementary electrical connecting device may exhibit differing geometrical orientations.

For example, in some arrangements, the electrical connecting device of the electrical connecting system includes a flexible printed circuit, and/or the complementary connecting device includes a zero-insertion-force (ZIF) plug-in connector. The ZIF plug-in connector may in this case be arranged on a printed circuit board.

In some arrangements, the electrical connecting system may furthermore include a processor unit that is designed to control a flow of current at least through the contacted first terminal and to ascertain, on the basis of the controlled flow of current, a resultant electrical parameter which is determined at least partly by the first resultant parameter and indicates the first resultant parameter. In particular, the processor unit may be designed to control the flow of current through at least the contacted first terminal by means of a test circuit which includes the processor unit and the contacted first terminal.

Furthermore, in some arrangements, the electrical connecting device of the electrical connecting system may include a second terminal, whereby the complementary electrical connecting device is designed to contact also the second terminal of the electrical connecting device when the electrical connecting device and the complementary electrical connecting device are connected to one another, whereby a second resultant electrical parameter is assigned to the contacting of the second terminal, and the processor unit is designed to control a flow of current through the contacted first and second terminals and to ascertain, on the basis of the controlled flow of current, a third resultant electrical parameter which is determined at least partly by the first and the second resultant parameter and indicates the first and the second resultant parameter.

According to another aspect, a method is described for determining a geometrical orientation of a connection within an electrical connecting system. The process includes providing an electrical connecting device with at least one first terminal for contacting by a complementary electrical connecting device, whereby the first terminal comprises a plurality of first contact regions, whereby differing first electrical parameters are assigned to the first contact regions, so that in the event of a contacting of the first terminal by the complementary connecting device a first resultant parameter is assigned to the contacting of the first terminal, which is determined by at least one of the first parameters and indicates in which first contact region or in which group of first contact regions the contacting exists, whereby the first contact region or the group of first contact regions in which the contacting exists is defined by the geometrical orientation of the connection between the connecting device and the complementary connecting device; providing a complementary electrical connecting device which is connected to the electrical connecting device and thereby contacts at least the first terminal of the electrical connecting device; generating a flow of current through at least the contacted first terminal; registering, on the basis of the generated flow of current, a resultant electrical parameter which is determined at least partly by the first resultant parameter and which indicates at least the first resultant parameter; and ascertaining a geometrical orientation of the connection of the electrical connecting devices on the basis of the indication of at least the first resultant parameter.

The method, in some arrangements, may be put into effect as part of an at least partly automated procedure, for example for producing an electrical system. In particular, the process steps of generating a flow of current, of registering a resultant electrical parameter, and of ascertaining a geometrical orientation of the connection may respectively be carried out by means of one or more processor units.

BRIEF DESCRIPTION OF THE DRAWINGS

Further features and advantages of the present disclosure will become clear from the following detailed description and also from the appended drawings. Shown are.

DETAILED DESCRIPTION

Figure 1:
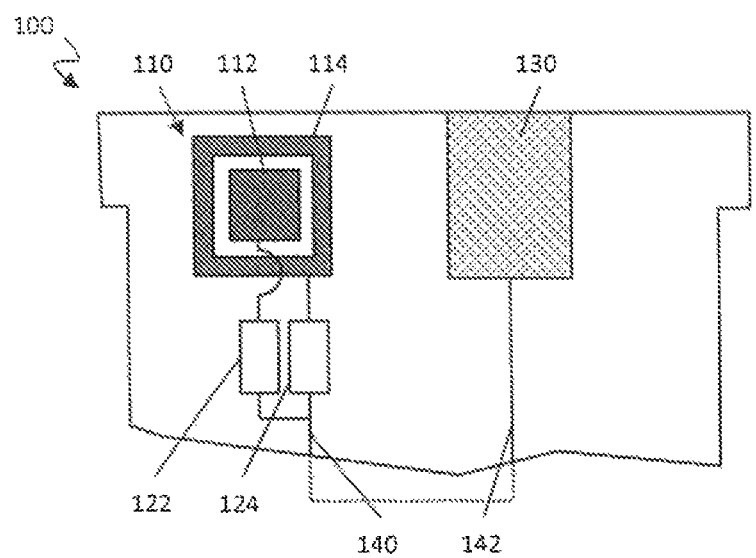
FIG. 1 a schematic representation of an embodiment of an electrical connecting device according to the present disclosure.

FIG. 1 shows an electrical connecting device 100 that is suitable to indicate a geometrical orientation of a connection between the connecting device 100 and a complementary electrical connecting device. The connecting device 100 includes a first terminal 110 for contacting by the complementary connecting device. The first terminal 110 comprises, in turn, several first contact regions 112, 114 to which differing first electrical parameters, represented in exemplary manner by differing resistances 122, 124, are assigned. The connecting device 100 further includes a further terminal 130 and also cores 140, 142 which are respectively connected to one of the terminals 110, 130.

In the event of contacting of the connecting device 100 by a complementary connecting device the mechanical connection of the two connecting devices may exhibit differing geometrical orientations. With such differing orientations of the connection, the contacting of the first terminal 110 occurs in respectively differing contact regions 112, 114. By reason of the differing resistances 122, 124 which are assigned to the individual contact regions 112, 114 of the first terminal, in this case correspondingly differing first resultant parameters (i.e. total resistance values) have also been assigned to the so different contacting points of the first terminal 110. In this way, an assignment is made between the differing first resultant parameters, on the one hand, and differing geometrical orientations of a connection between the two connecting devices, on the other hand. Therefore if in the case of an existing contacting the first resultant parameter is registered, the geometrical orientation of the existing connection can be determined at least partly from this.

In the case where a connection is present between the electrical connecting device 100 and a complementary connecting device, the first resultant parameter can be ascertained, for example by means of a test circuit that encompasses the contacting of the first terminal 110. As indicated in FIG. 1 by the dotted line, such a test circuit may also include an electrical connection between the first terminal 110 and the further terminal 130 of the connecting device 100. For this purpose, the cores 140, 142 connected to the differing terminals 110, 130 may, for instance, be electrically bridged at least temporarily.

The embodiment of the electrical connecting device 100 shown in FIG. 1 includes, in addition to the first terminal 110, also the further terminal 130. The described mode of operation of the connecting device 100 for ascertaining a geometrical orientation of a connection between the connecting device 100 and a complementary connecting device may, however, also be realised in the case where solely the first terminal 110 is present. Conversely, the described mode of operation of the electrical connecting device 100 can also be applied in the case where a larger number of further terminals 130 are present.

Furthermore, the first terminal 110 is represented for illustrative purposes with merely two contact regions 112, 114, this corresponding to a simplest design of the first terminal 110. In alternative embodiments the first terminal 110 may, on the other hand, also comprise a larger number of contact regions 112, 114 to which differing first electrical parameters 122, 124 are assigned. A larger number of first contact regions may in this case be suitable, in particular, to make more precisely determinable the geometrical orientation of a connection between the connecting device 100 and a complementary connecting device.

In the example represented, the first electrical parameters are defined by differing electrical resistances 122, 124 which as integral parts of the electrical connecting device 100 are assigned to the differing first contact regions 112, 114. In alternative versions, the first electrical parameters may, however, also correspond to other electrical measured quantities instead of a resistance, such as, for example, to differing electrical capacitances or inductances, and may be defined by components of the connecting device 100 that are suitable for this. In addition, to at least one of the contact regions 112, 114 no electrical component can be assigned that defines the corresponding first electrical parameter for this contact region. Such a contact region may therefore be (substantially) neutral in its electrical properties. In this case a contacting of the terminal in that contact region to which no parameter defined by at least one electrical component is assigned may correspond to a preferred orientation of a connection between the connecting device 100 and a complementary connecting device.

If the first electrical parameters are defined by differing electrical resistances, a lower electrical resistance may be assigned in particular to that contact region, the contacting of which by the complementary connecting device corresponds to a preferred orientation of the connection, than to another contact region of the first terminal.

Figure 2:
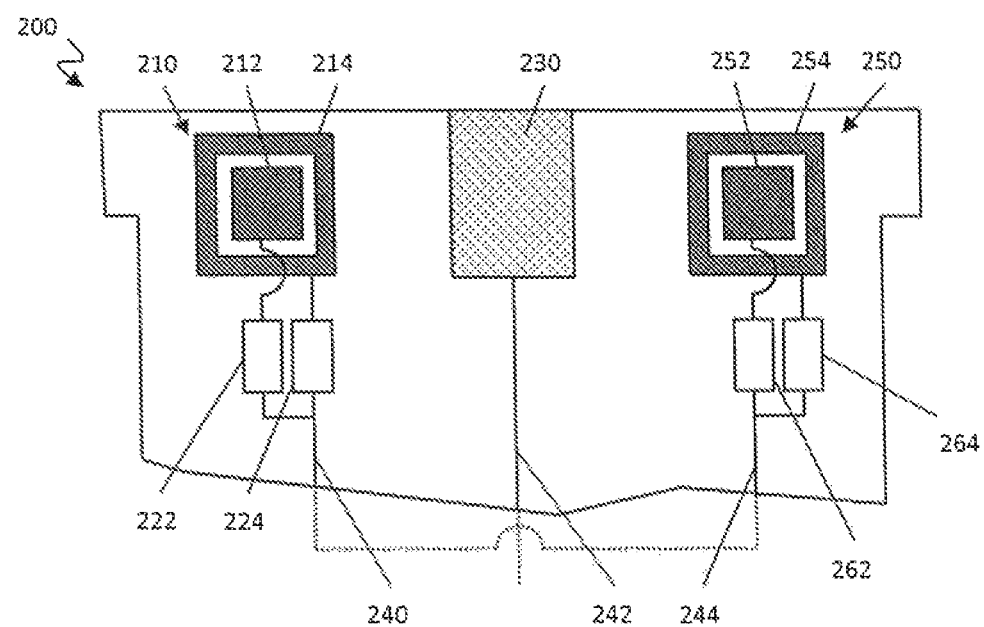
FIG. 2 a schematic representation of a further embodiment of an electrical connecting device according to the present disclosure.

FIG. 2 shows a further embodiment of an electrical connecting device 200 that is suitable to indicate a geometrical orientation of a connection between the connecting device 200 and a complementary electrical connecting device. Like the connecting device 100 shown in FIG. 1, the connecting device 200 of FIG. 2 also includes a first terminal 210 with several first contact regions 212, 214 to which differing electrical parameters 222, 224 are assigned, whereby, here too, the first terminal 210 is connected to a core 240. Furthermore, the electrical connecting device 200 also includes a further terminal 230 which has likewise been connected to a core 242. Diverging from the example from FIG. 1, however, the electrical connecting device 200 of FIG. 2, includes, in addition, a second terminal 250 which, in a manner analogous to the first terminal 210, comprises several second contact regions 252, 254 to which differing second electrical parameters 262, 264 are assigned, and which has likewise been connected to a core 244.

In the event of a contacting both of the first terminal 210 and of the second terminal 250 by a complementary connecting device, in this case a first, respectively a second, resultant parameter is assigned to each of the contacting points. Each of these resultant parameters has in turn—depending on the respective contact region in which the contacting exists—been determined by at least one of the first and second electrical parameters. Analogously to what was described in the foregoing, in this way each of the first and second resultant parameters is suitable to indicate a geometrical orientation of the connection between the connecting device 200 and the complementary connecting device.

Analogously to the example from FIG. 1, also in the case of the electrical connecting device 200 of FIG. 2 both the first and the second resultant parameter can be ascertained by an appropriate test circuit which includes the respective contacting of the first or of the second terminal 210, 250. In addition, for the purpose of such a test circuit the first and the second terminal 210, 250, as parts of the same test circuit, can be electrically connected, at least for a time. In this case, from the first and the second resultant parameter a third resultant parameter for such a combining test circuit would arise. For example, the third resultant parameter may arise cumulatively from the first and the second resultant parameter if, for instance, in the case of the differing parameters it is a question of differing electrical resistances and the first and the second terminal 210, 250 in the test circuit are connected in series. In the case where use is made of deviating electrical parameters or of a deviating test circuit, the third resultant parameter may, however, also arise in another way, at least partly, from the first and the second resultant parameter.

A third resultant parameter ascertained in the manner described may in this case be suitable to indicate unambiguously both the first and the second resultant parameter. For this purpose, the first and the second parameters may be chosen to be so different that from the third resultant parameter both the first contact region, in which the contacting of the first terminal 210 is made, and the second contact region, in which the contacting of the second terminal 250 is made, can be ascertained unambiguously from the registered third resultant parameter. In the example represented, the second electrical parameters 262, 264 may differ, for example, by an order of magnitude from the respective first parameters 222, 224. A sum of each of the first parameters 222, 224 with each of the second parameters 262, 264, such as would arise in the case of a series connection of differing resistances, would in this case allow the first and also the second parameter to be inferred unambiguously. In alternative designs, the first and second parameters may also be chosen differently, in order, given suitable registration of the third resultant parameter, to enable an ascertaining of the first and second resultant parameter from the registered third resultant parameter.

Both in the case of the first terminal 210 and in the case of the second terminal 250 of the connecting device 200 it may be a question of test terminals which are specially provided for the purpose of ascertainment of the geometrical orientation of an existing connection between the connecting device 200 and the complementary connecting device. In this case the first and the second terminal, or, to be more exact, the cores 240, 244 to which these terminals have respectively been connected, might be permanently bridged, i.e. connected in electrically conducting manner. As an alternative to this, in the case of at least one of first and second terminal 210, 250 it may also be a question of a merely partly modified terminal which also in the control mode of the connecting device is utilised for the purpose of signal transmission. In such a version, the first and the second terminal 210, 250 would be electrically bridged temporarily only for the purpose of the connection test that is described, whereas in the regular mode they are electrically isolated from one another. In addition, designs are conceivable in which at least one of the first and the second terminal 210, 250 is connected both to a core for signal transmission and to the respective other of first and second terminal 210, 250.

In the case of the electrical connecting device 200 it may be a question, in particular, of a flexible printed circuit with several cores. In this case, one or more cores may be arranged alongside one another per millimetre of a width of the flexible printed circuit.

In the latter case it is advantageous if a parameter 222, 262 that influences the contacting only slightly is assigned respectively to a contact region 212, 252, which is provided by way of preferred contact region of the respective terminal 210, 250 for a regular mode of the connecting device 200. For example, the middle contact regions 212, 252 which are represented might correspond respectively to a contacting in the case of a preferred geometrical orientation of the connection, whereby an electrical parameter determined by an electrical component 222, 262 is assigned to none of the contact regions 212, 252, whereas parameters that are determined by components 224, 264 are assigned to other contact regions 214, 254 of the respective terminals 210, 250. The preferred contact regions 212, 252 may accordingly be designed to be substantially electrically neutral. In particular, a lower electrical resistance may be assigned to the preferred contact regions 212, 252 than to other contact regions 214, 254 of the respective terminal 210, 250.

For the purpose of ascertaining a geometrical orientation of a connection between the electrical connecting device 200 and the complementary connecting device it is, in addition, advantageous if—as in the example represented, where several terminals 210, 230, 250 are present—at least one of first and second terminal 210, 250 is arranged in an outer position with respect to the remaining terminals within the electrical connecting device 200. Furthermore, it is advantageous if in the case where several terminals 210, 250 are present that are suitable to indicate a geometrical orientation of the connection these terminals are arranged in such a manner with respect to one another that a spacing which is as large as possible is present between them.

Figure 3:
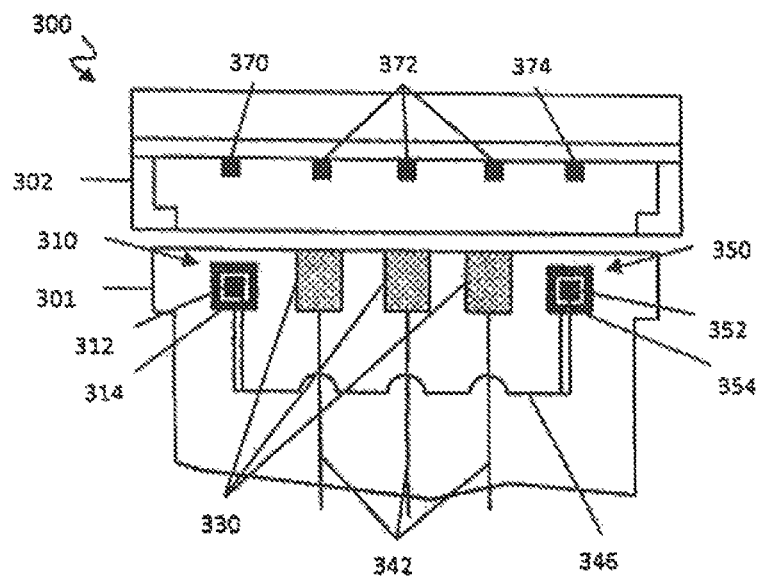
FIG. 3 a schematic representation of an embodiment of an electrical connecting system according to the present disclosure.

FIG. 3 shows an electrical connecting system 300 consisting of an electrical connecting device 301 and a complementary connecting device 302. In the example represented, the connecting devices 301, 302 of the connecting system 300 are in an unconnected state. Similarly to the connecting device 200 of FIG. 2, the connecting device 301 of FIG. 3 also includes a first terminal 310 and a second terminal 350 which respectively exhibit several first and second contact regions 312, 314, 352, 354 to which, in turn, differing first or second electrical parameters are assigned. Over and above these, the connecting device 301 exhibits several further terminals 330 which have respectively been connected to a core 342. In the example shown in FIG. 3, the first terminal 310 and the second terminal 350 are permanently connected to one another by the electrical connection 346. At the same time, neither the first nor the second terminal 310, 350 is connected to a separate core that would make the corresponding terminal suitable for signal transmission in the control mode. In the example represented, the first and the second terminal 310, 350 of the connecting device 301 consequently serve primarily for the ascertainment of a geometrical orientation of a connection to the complementary connecting device 302. The complementary connecting device 302 exhibits, in addition, a corresponding first terminal 370, a corresponding second terminal 374 and also several corresponding further terminals 372, which have respectively been provided for the purpose of contacting one of the terminals 310, 330, 350 of the electrical connecting device 301.

In the case of the connecting device 301, by virtue of the electrical connection 346 between the first and the second terminal 310, 350 all the contact regions both of the first and of the second terminal 310, 350 are electrically interconnected. In addition, all the terminals 310, 330, 350 in the case of the connecting device 301 are situated in one plane, this corresponding, for instance, to the arrangement of terminals in a ribbon cable or in a flat-band or flexible lead. The corresponding terminals 370, 372, 374 of the complementary connecting device 302 which are represented exhibit a similar arrangement, such as is used, for instance, in the case of zero-insertion-force (ZIF) plug-in connectors.

The connecting system 300 that is represented is particularly suitable for application in connection with flexible printed circuits and ZIF plug-in connectors. In the case of the connecting device 301, this has furthermore been indicated by the fact that a plurality of further terminals 330 are respectively connected to a core 342, whereby these cores have likewise been arranged in one plane and continue in the form of a flexible printed circuit which is provided as an integral part of the connecting device 301.

The connecting system 300 that is represented permits a multi-contact signal transmission by the connecting system 300 by means of the further terminals 330 and the corresponding further terminals 372 in the electrical connecting device 301 and in the corresponding connecting device 302, respectively. At the same time, a contacting of the first and second terminal 310, 350 of the connecting device 301 by the corresponding first and second terminals 370, 374 of the corresponding connecting device 302 and by means of the electrical connection 346 between the first and the second terminal 310, 350 permits the simple setting-up of a test circuit through the contacting points of both terminals 310, 350. In the manner previously described, a geometrical orientation of the connection can thus be ascertained in a connected state of the connecting devices 301, 302.

FIGS. 4A to 4D show several examples of differing geometrical orientations of a connection of the electrical connecting system 300 in a connected state of the connecting device 301 and of the complementary connecting device 302. Diverging from the representation in FIG. 3, the connecting system 300 in the examples shown in FIGS. 4A to 4D further includes a processor unit 380 that is designed for controlling a flow of current through the contacted first and second terminals 310, 350 of the connecting system 300. The processor unit 380 has furthermore been designed to ascertain, on the basis of the controlled flow of current, a third resultant parameter which is determined at least partly by a first resultant parameter assigned to the contacting of the first terminal 310 and also by a second resultant parameter assigned to the contacting of the second terminal 350.

Figure 4A:
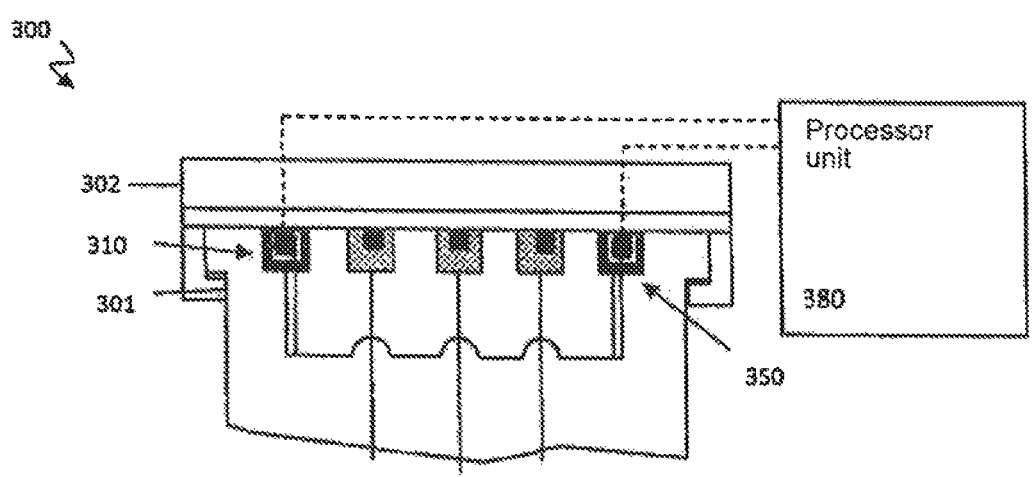
FIGS. 4A to 4D schematic representations of a further embodiment of an electrical connecting system according to the present disclosure with differing geometrical orientations of the connection.

FIG. 4A shows the electrical connecting system 300 in a connected state, whereby the connection consisting of the electrical connecting device 301 and the corresponding connecting device 302 exhibits a preferred geometrical orientation. In the case of the geometrical orientation of the connection represented in FIG. 4A, all the terminals of the electrical connecting device 301 are contacted by corresponding terminals of the corresponding connecting device 302. In addition, the first and the second terminal of the connecting device 301 are respectively contacted in a contact region 312, 352, the assigned electrical parameter of which indicates the preferred geometrical orientation of the connection.

Consequently a third resultant parameter is assigned to the test circuit represented by the dashed line and controlled by the processor unit 380, which is determined from the first resultant parameter assigned to the contacting of the first terminal 310 and from the second resultant parameter assigned to the contacting of the second terminal 350. Consequently the processor unit 380 can ascertain, on the basis of the registered third resultant parameter, that the connection of the electrical connecting devices 301, 302 exhibits the preferred geometrical orientation.

Figure 4B:
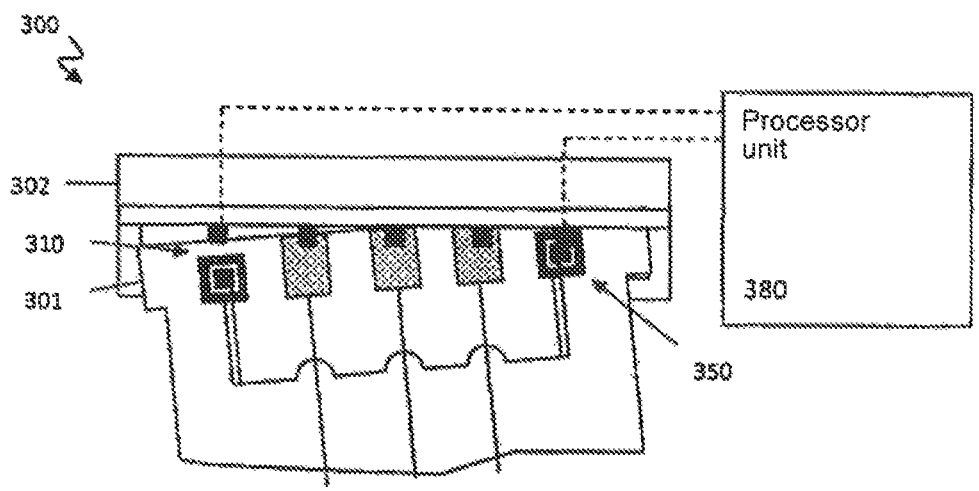

FIG. 4B shows the electrical connecting system 300 in a further connection state, whereby the geometrical orientation of the connection between the connecting device 301 and the corresponding connecting device 302 exhibits a geometrical orientation diverging from the preceding example.

In the case of the example represented in FIG. 4B the connecting device 301 is greatly tilted in relation to the corresponding connecting device 302. With respect to the contacting points of the first and also of the second terminal 310, 350 of the connecting device 301, this tilting has the consequence that the first terminal 310 is not contacted at all, whereas the second terminal 350 is contacted simultaneously in several contact regions. In particular by virtue of the failed contacting of the first terminal, in the case represented it is not possible to set up a test circuit, controlled by the processor unit 380, through the first and second terminal 310, 350.

With respect to a registration of the third resultant parameter in the present example by the processor unit 380, a failed setting-up of the test circuit would indicate a corresponding geometrical orientation of the connection, which diverges greatly from a preferred geometrical orientation. For instance, were it to be a question of differing electrical resistances in the case of the electrical parameters that are respectively assigned to the individual contact regions of the first and second terminal 310, 350, then the third resultant parameter might consist of a resultant total resistance. In the present example shown in FIG. 4B such a total resistance would be registered as infinite and would consequently indicate a failed contacting of at least one of the first and the second terminal 310, 350. This, in turn, indicates a geometrical orientation of the connection that diverges correspondingly greatly from the preferred orientation and therefore, for example, exhibits an inadequate mechanical stability.

Figure 4C:
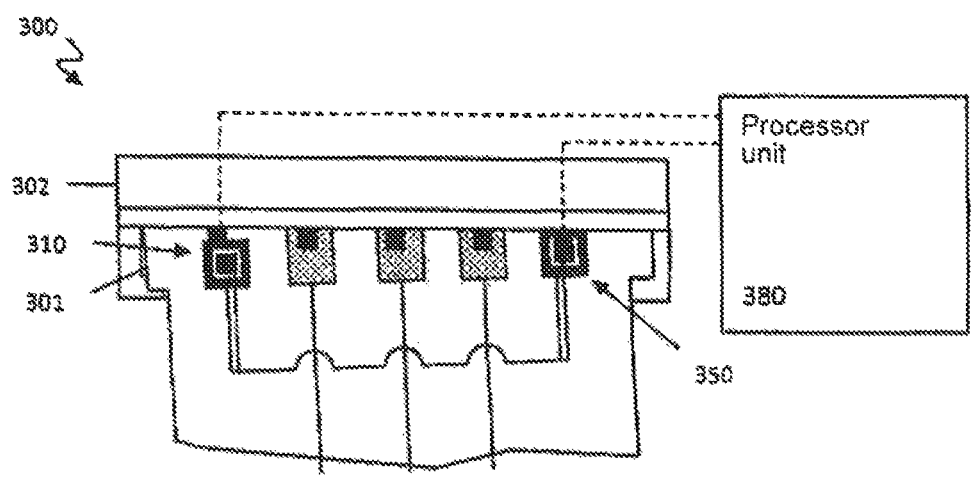

FIG. 4C shows the connecting system 300 in a further connected state between connecting device 301 and corresponding connecting device 302, whereby the connection exhibits, once again, a different geometrical orientation.

In comparison with the preferred orientation shown in FIG. 4A, in FIG. 4C the connecting device 301 is only slightly tilted in relation to the corresponding connecting device 302. In addition, the connecting device 301 is set back somewhat in relation to the corresponding connecting device 302. With such a geometrical orientation of the connection, the first terminal 310 of the connecting device 301 is contacted only in an outer contact region 314, whereas the second terminal 350 is contacted simultaneously in several of its contact regions 352, 354. Consequently a first resultant parameter is assigned to the contacting of the first terminal, which is determined solely by a parameter assigned to the outer contact region 314. In contrast, a second resultant parameter is assigned to the contacting of the second terminal 350, which simultaneously is determined by an electrical parameter assigned to the inner contact region 352, 354 of the second terminal 350 and by an electrical parameter assigned to the outer contact region 354 of the second terminal 350.

By virtue of a test circuit, controlled by means of the processor unit 380, through the first and also the second terminal 310, 350, consequently a third resultant parameter can be ascertained which firstly indicates existing contacting points in both the first and the second terminal 310, 350. This third resultant parameter can, in addition, be analysed by the processor unit 380 with respect to the first and second resultant parameter. From this, the contact regions both of the first and of the second terminal 310, 350, in which, or in the grouping of which, the respective contacting exists, can finally be ascertained, so that from this the existing geometrical orientation of the connection can finally be inferred.

Figure 4D:
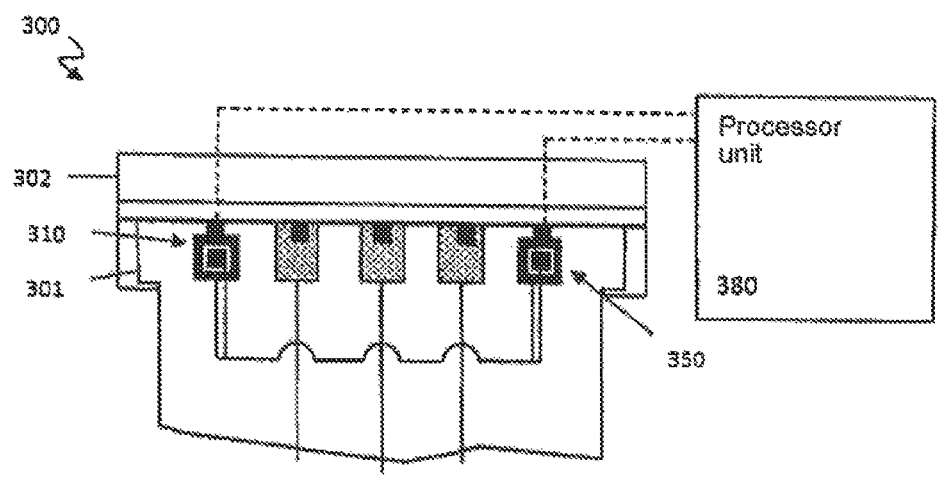

FIG. 4D shows the electrical connecting system 300 in a further connected state, whereby the connection between the electrical connecting device 301 and the complementary connecting device 302 exhibits, once again, a different geometrical orientation.

In comparison with the preferred orientation shown in FIG. 4A, in the case of the connection shown in FIG. 4D the electrical connecting device 301 is arranged, without tilting, slightly set back in relation to the corresponding connecting device 302. The represented geometrical orientation of the connection has the consequence that both the first and the second terminal 310, 350 of the connecting device 301 are respectively contacted in an outer contact region 314, 354 by the complementary connecting device 302. The first and the second resultant parameter, which are assigned to the contacting of the first and of the second terminal 310, 350, respectively, consequently indicate respectively a contacting in an outer contact region 314, 354.

When setting up a test circuit through the two contacted first and second terminals by means of the processor unit 380, a third resultant parameter can consequently be registered which indicates the described contacting and consequently the corresponding geometrical orientation of the connection.

The differing geometrical orientations, described in FIGS. 4A to 4D, of a connection between the electrical connecting device 301 and the corresponding connecting device 302 represent only a selection of possible connection states, which is not to be interpreted as definitive. In particular, providing more than two contact regions with differing assigned electrical parameters in at least one of the terminals can permit a more precise analysis of diverse further geometrical orientations by a suitable test circuit than of those represented. To this end, in addition also more than two terminals may be provided, which are subdivided into differing contact regions.

Figure 5:
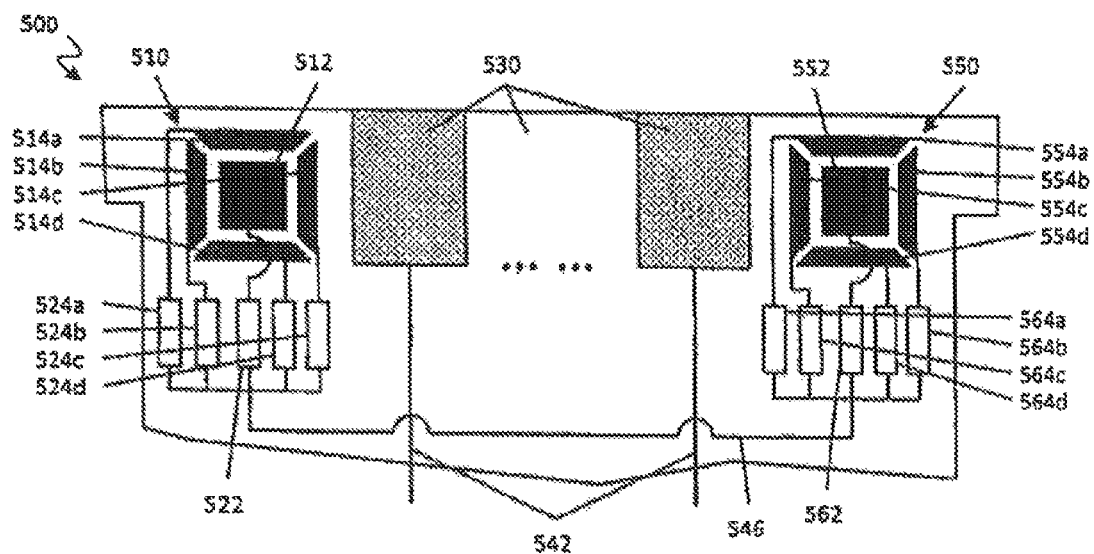
FIG. 5 a schematic representation of a further embodiment of an electrical connecting device according to the present disclosure.

FIG. 5 shows a further embodiment of an electrical connecting device 500 of the type presented herein. Like several of the preceding examples, the connecting device 500 of FIG. 5 also includes a first terminal 510 and a second terminal 550 which have respectively been subdivided into several contact regions 512, 514a-d, 552, 554a-d. Differing electrical parameters, represented by the resistances 522, 524a-d, 562, 564a-d, have once again been assigned to these contact regions. Furthermore, the connecting device 500 also includes several further terminals 530 which have respectively been connected to a core 542. As in the examples shown in FIG. 3 and FIGS. 4A-4D, also in the case of the connecting device 500 of FIG. 5 the first and the second terminal 510, 550—and thereby, once again, in particular any contact regions of the first and of the second terminal—are connected to one another via a firm electrical connection 546.

Diverging from the examples represented previously, however, in the case of the connecting device 500 both the first and the second terminal 510, 550 comprise a larger number of contact regions 512, 514a-d, 552, 554a-d. In this case, in addition a plurality of contact regions 514a-d, 554a-d respectively surround at least partly a middle contact region 512, 552. Depending on the contacting of one or more contact regions of each of the terminals 510, 550, a resultant parameter assigned to such a contacting may assume a relatively large number of differing values. By ascertaining the respectively existing resultant parameters, this permits a more precise differentiation of differing geometrical orientations of a connection of the electrical connecting device 500 to a corresponding connecting device.

In the example represented, a contacting of the respectively middle contact region 512, 552 of the terminals 510, 550 by a complementary connecting device corresponds to a preferred orientation of the connection. In addition, the resultant parameters are defined by differing electrical resistances. In this case an electrical resistance of less than 1 kilohm—for example in the case of the first terminal 220 ohms, and in the case of the second terminal 470 ohms—is respectively assigned to the middle contact regions 512, 552 of the first and second terminal 510, 550. On the other hand, resistances of the order of magnitude of 1 kilohm—for example, 1, 2, 3.9 and 4.7 kilohms—are assigned to the remaining contact regions 514a-d of the first terminal 510, and resistances of the order of magnitude of 10 kilohms— for example, 10, 20, 39 and 47 kilohms—to the remaining contact regions 554a-d of the second terminal 550.

Figure 6:
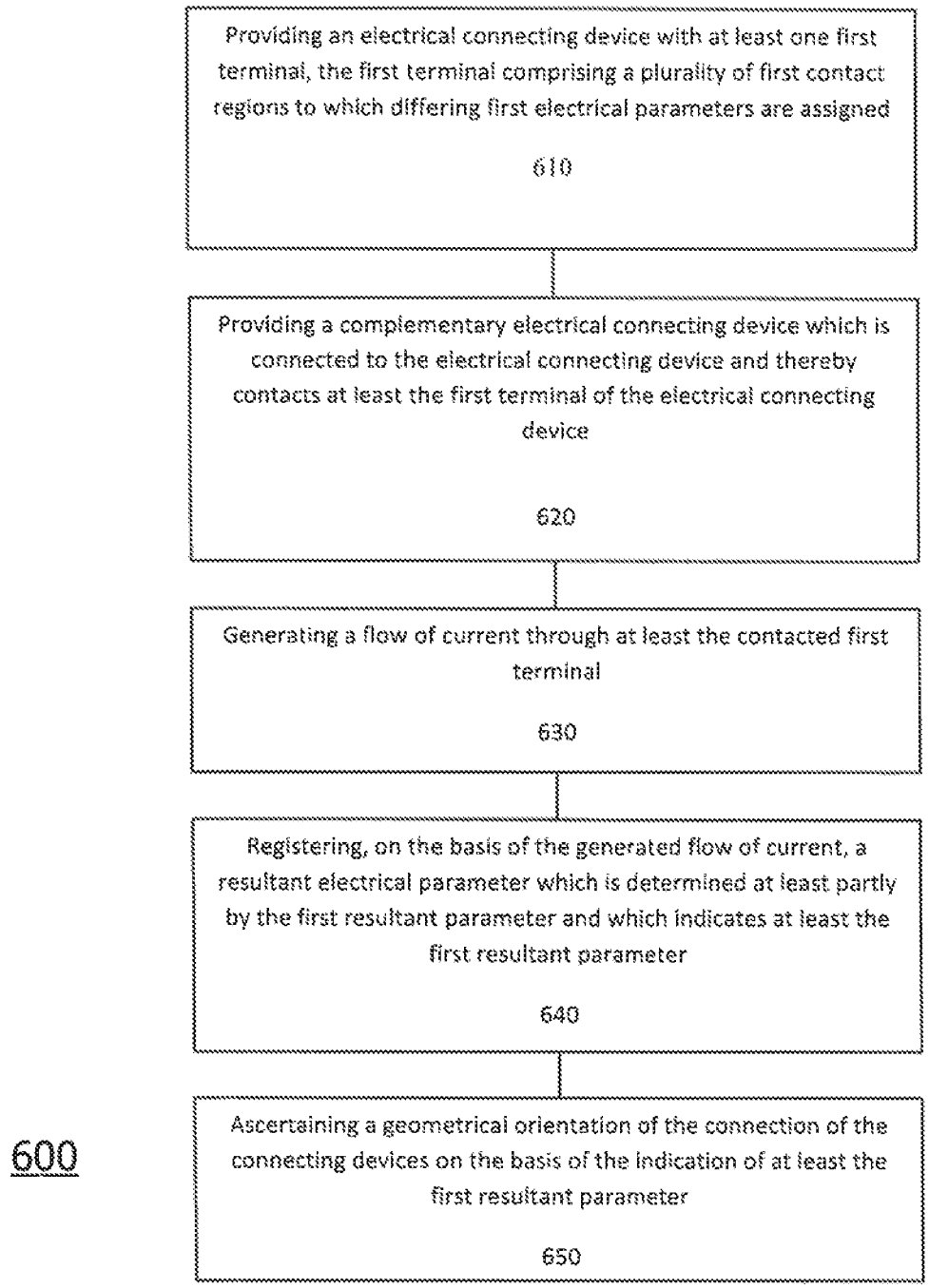
FIG. 6 a flow chart of an embodiment of a method for determining a geometrical orientation of a connection within an electrical connecting system according to the present disclosure.

FIG. 6 shows a flow chart of a method for determining a geometrical orientation of a connection between the electrical connecting device 100, 200, 301, 500 described in the foregoing and a complementary connecting device 302. In this case, in a first process step 610 an electrical connecting device with at least one first terminal is provided, whereby the first terminal comprises a plurality of first contact regions to which differing first electrical parameters are assigned. In the case of such an electrical connecting device it may be a question, in particular, of one of the examples 100, 200, 301, 500 represented schematically in FIGS. 1 to 5.

In a second process step 620 a complementary electrical connecting device is provided which is connected to the electrical connecting device and thereby contacts at least the first terminal of the electrical connecting device. In the case of the complementary electrical connecting device it may likewise be a question of one of the versions of a connecting device 302 described in the foregoing and represented schematically in FIGS. 3 to 4D.

In a further process step 630 a flow of current through at least the contacted first terminal is generated. The generation of the flow of current through the contacted first terminal may in this case be controlled, for example, by a processor unit functionally connected to the connecting device and to the complementary connecting device.

In a further process step 640, on the basis of the generated flow of current a resultant electrical parameter is registered which is determined at least partly by a first resultant parameter assigned to the contacting of the first terminal and which indicates at least the first resultant parameter. As described previously, in addition a flow of current through a second contacted terminal can also be generated. In this case, in the step of the registering 640 of a resultant electrical parameter a third resultant electrical parameter can be registered which is determined at least partly both by the first resultant parameter and by the second resultant parameter and which indicates each of these first and second resultant parameters.

In a further process step 650, on the basis of the indication of at least the first resultant parameter a geometrical orientation of the connection of the connecting devices is ascertained. The step of the ascertaining 650 of a geometrical orientation may in this case be undertaken, once again, by a processor unit 380 functionally connected to the connecting devices.

The present disclosure has mainly been described in connection with multi-core flexible printed circuits and ZIF connectors. However, it is obvious that the underlying functionality can also be put into effect by other electrical connecting devices. These include, in particular, also single-contact connecting devices. In addition, the invention can also be employed advantageously in connection with connecting devices larger than those described.

The arrangements shown and described in detail herein are exemplary and not intended to limit the scope of the invention. Rather, all additional aspects, combinations, arrangements, and/or advantages within the scope of the appended claims are expressly reserved.

We claim:

1. An electrical connecting device for electrically connecting a ribbon cable or a flexible printed circuit, designed to indicate a geometrical orientation of a connection between the electrical connecting device and a complementary electrical connecting device when the electrical connecting device is connected to the complementary electrical connecting device, comprising:
at least one first terminal for contacting by a corresponding terminal of the complementary electrical connecting device, wherein:
the first terminal comprises a plurality of first contact regions that are substantially planar and extend in two directions in one plane, the two directions being different than one another, and each of the plurality of first contact regions being electrically conductive,
differing first electrical parameters are assigned to the first contact regions, so that in the event of a contacting of the first terminal by the corresponding terminal of the complementary electrical connecting device, a first resultant parameter is assigned to the contacting of the first terminal, which is determined by at least one of the first electrical parameters and indicates in which first contact region, or in which group of first contact regions, the contacting exists, and
the first contact region or the group of first contact regions in which the contacting exists is defined by the geometrical orientation of the connection between the electrical connecting device and the complementary electrical connecting device.

2. The electrical connecting device according to claim 1, wherein at least one second terminal of the electrical connecting device further comprises a plurality of second contact regions, and differing second electrical parameters are assigned to the second contact regions, so that in the event of an electrical contacting of the second terminal by the complementary electrical connecting device, a second resultant parameter is assigned to the contacting of the second terminal, which is determined by at least one of the second electrical parameters.

3. The electrical connecting device according to claim 2, wherein the first and the second electrical parameters are different, such that in the event of an electrical contacting of the first and of the second terminal by the complementary electrical connecting device, and in the case where a common electrical connection is present by virtue of the contacting points of the first and of the second terminal, a third resultant parameter is assigned to the electrical connection, which is determined at least partly by the first and the second resultant parameter and indicates the first and the second resultant parameter.

4. The electrical connecting device according to claim 1, wherein at least one of the electrical parameters is defined by an electrical component.

5. The electrical connecting device according to claim 4, wherein the electrical component is a part of the connecting device.

6. The electrical connecting device according to claim 1, wherein each of the plurality of first contact regions are electrically connected to one another.

7. The electrical connecting device according to claim 1, wherein the electrical connecting device comprises at least three terminals, and
wherein the first terminal is one of the at least three terminals and is arranged in an outer position with respect to the remaining terminals.

8. The electrical connecting device according to claim 1, wherein the electrical connecting device comprises several terminals which are arranged at least substantially in one plane, and
wherein the first terminal is one of the several terminals.

9. The electrical connecting device according to claim 1, wherein the electrical connecting device comprises several terminals and further comprises a ribbon cable with several cores, and
wherein at least some of the several terminals are connected to the several cores.

10. The electrical connecting device according to claim 1, wherein a lower electrical resistance is assigned to a contacting in one of the contact regions of a terminal than to a contacting in another contact region of the same terminal.

11. The electrical connecting device according to claim 1, wherein the complementary electrical connecting device is designed to contact at least the first terminal of the electrical connecting device when the electrical connecting device and the complementary electrical connecting device are connected to one another, and
wherein a connection between the electrical connecting device and the complementary electrical connecting device may exhibit differing geometrical orientations.

12. The electrical connecting device according to claim 11, wherein a flow of current at least through the contacted first terminal is controlled by a processor unit, the processor unit ascertaining, on the basis of the controlled flow of current, a resultant electrical parameter which is determined at least partly by the first resultant parameter and indicates the first resultant parameter.

13. The electrical connecting device according to claim 12, wherein:

the electrical connecting device includes a second terminal;

the complementary electrical connecting device is designed to contact the second terminal of the electrical connecting device when the electrical connecting device and the complementary electrical connecting device are connected to one another, wherein a second resultant electrical parameter is assigned to the contacting of the second terminal; and a flow of current through the contacted first and second terminals is further controlled by the processor unit, the processor unit ascertaining, on the basis of the controlled flow of current, a third resultant electrical parameter which is determined at least partly by the first and the second resultant parameter and indicates the first and the second resultant parameter.

14. A method for electrically connecting a ribbon cable or a flexible printed circuit and determining a geometrical orientation of a connection within an electrical connecting system, comprising:

providing an electrical connecting device with at least one first terminal for contacting by a corresponding terminal of a complementary electrical connecting device, wherein the first terminal comprises a plurality of first contact regions that are substantially planar and extend in two directions in one plane, the two directions being different than one another, and each of the plurality of first contact regions being electrically conductive, wherein differing first electrical parameters are assigned to the first contact regions, so that in the event of a contacting of the first terminal by the corresponding terminal of the complementary electrical connecting device, a first resultant parameter is assigned to the contacting of the first terminal, which is determined by at least one of the first electrical parameters and indicates in which first contact region, or in which group of first contact regions, the contacting exists, and wherein the first contact region, or the group of first contact regions in which the contacting exists, is defined by the geometrical orientation of the connection between the electrical connecting device and the complementary electrical connecting device;

providing the complementary electrical connecting device, which is connected to the electrical connecting device and thereby contacts the at least one first terminal of the electrical connecting device;

generating a flow of current through the at least one contacted first terminal;

registering, on the basis of the generated flow of current, a resultant electrical parameter which is determined at least partly by the first resultant parameter and which indicates at least the first resultant parameter; and ascertaining a geometrical orientation of the connection of the electrical connecting device on the basis of the indication of at least the first resultant parameter.

15. The electrical connecting device according to claim 1, wherein values of the first electrical parameters are selected from one of a group including an electrical resistance, an electrical capacitance, and an electrical inductance.

16. The method according to claim 14, wherein values of the first electrical parameters are selected from one of a group including an electrical resistance, an electrical capacitance, and an electrical inductance.

17. The electrical connecting device according to claim 1, wherein the geometrical orientation of the connection between the electrical connecting device and the complementary electrical connecting device includes the electrical connecting device being tilted or rotated with respect to the complementary electrical connecting device.

18. The method according to claim 14, wherein the act of ascertaining the geometrical orientation of the connection of the electrical connecting device includes determining whether the electrical connecting device is tilted or rotated with respect to the complementary electrical connecting device.

* * * * *